United States Patent
Yang

(10) Patent No.: US 10,249,582 B2
(45) Date of Patent: Apr. 2, 2019

(54) RADIO FREQUENCY (RF) DEVICES WITH RESONANT CIRCUITS TO REDUCE COUPLING

(71) Applicant: NXP USA, INC., Austin, TX (US)

(72) Inventor: Nick Yang, Wilmette, IL (US)

(73) Assignee: NXP USA, Inc., Austin, TX (US)

( * ) Notice: Subject to any disclaimer, the term of this patent is extended or adjusted under 35 U.S.C. 154(b) by 203 days.

(21) Appl. No.: 15/383,775

(22) Filed: Dec. 19, 2016

(65) Prior Publication Data

US 2018/0175792 A1   Jun. 21, 2018

(51) Int. Cl.
| | |
|---|---|
| *H03B 5/08* | (2006.01) |
| *H03F 1/02* | (2006.01) |
| *H03F 3/19* | (2006.01) |
| *H03F 3/21* | (2006.01) |
| *H03F 3/24* | (2006.01) |
| *H01L 23/66* | (2006.01) |
| *H01L 23/498* | (2006.01) |

(52) U.S. Cl.
CPC ........ *H01L 23/66* (2013.01); *H01L 23/49838* (2013.01); *H03B 5/08* (2013.01); *H03F 1/0288* (2013.01); *H03F 3/19* (2013.01); *H03F 3/21* (2013.01); *H03F 3/245* (2013.01); *H01L 2223/6611* (2013.01); *H03F 2200/114* (2013.01); *H03F 2200/451* (2013.01)

(58) Field of Classification Search
CPC ............... H01L 23/66; H03F 3/19; H03F 3/21
See application file for complete search history.

(56) References Cited

U.S. PATENT DOCUMENTS

| | | | | |
|---|---|---|---|---|
| 5,136,269 A | * | 8/1992 | Seitzer ............... | H01P 1/20363 333/204 |
| 5,164,690 A | * | 11/1992 | Yeh ..................... | H01P 1/20381 333/203 |
| 2010/0130069 A1 | * | 5/2010 | Fyne ................... | H01R 13/6471 439/676 |
| 2011/0025435 A1 | | 2/2011 | Gorbachov | |
| 2015/0002226 A1 | | 1/2015 | Meen Kuo et al. | |
| 2015/0002229 A1 | | 1/2015 | Kuo et al. | |
| 2015/0170986 A1 | | 6/2015 | Szymanowski et al. | |
| 2015/0263681 A1 | | 9/2015 | Embar et al. | |
| 2016/0308402 A1 | * | 10/2016 | Alavikia ............. | H01Q 21/065 |

OTHER PUBLICATIONS

Yang, Nick, U.S. Appl. No. 14/846,668, entitled,"Impedance Matching Device With Coupled Resonator Structure," filed Sep. 4, 2015.

* cited by examiner

*Primary Examiner* — Jeffrey M Shin

(57) ABSTRACT

The embodiments described herein use resonant circuits to provide isolation between closely proximate conductors. For example, these resonant circuits can be used to reduce unwanted electromagnetic coupling and minimize crosstalk energy between package leads, bonding wires, and circuit board traces on radio frequency (RF) electronic devices, including RF power amplifiers. To facilitate a reduction in electromagnetic coupling, the resonant circuit is configured resonate with the closely proximate conductors at a selected frequency $f_0$, and when resonating at the selected frequency $f_0$ the resonant circuit provides a path to ground for the crosstalk energy. This path to ground reduces the crosstalk energy that would otherwise be shared between the two closely proximate conductors, and thus provides the electromagnetic isolation between the conductors.

18 Claims, 8 Drawing Sheets

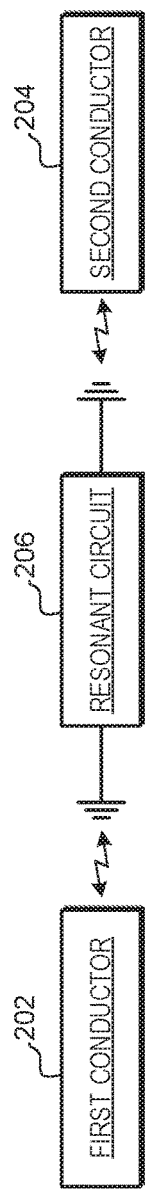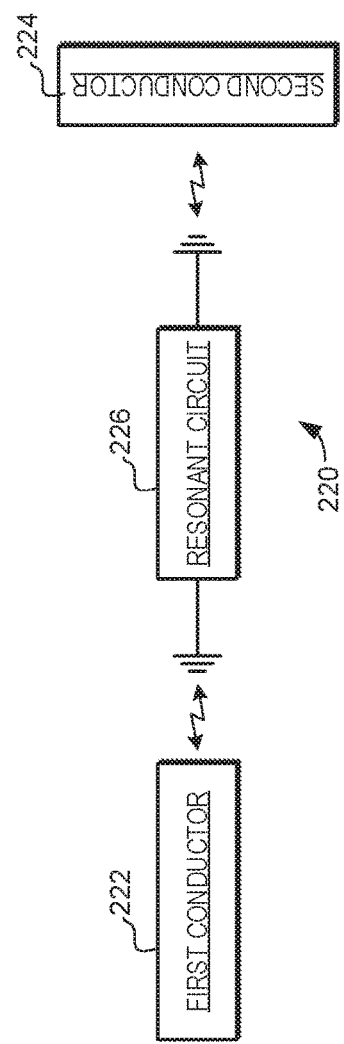

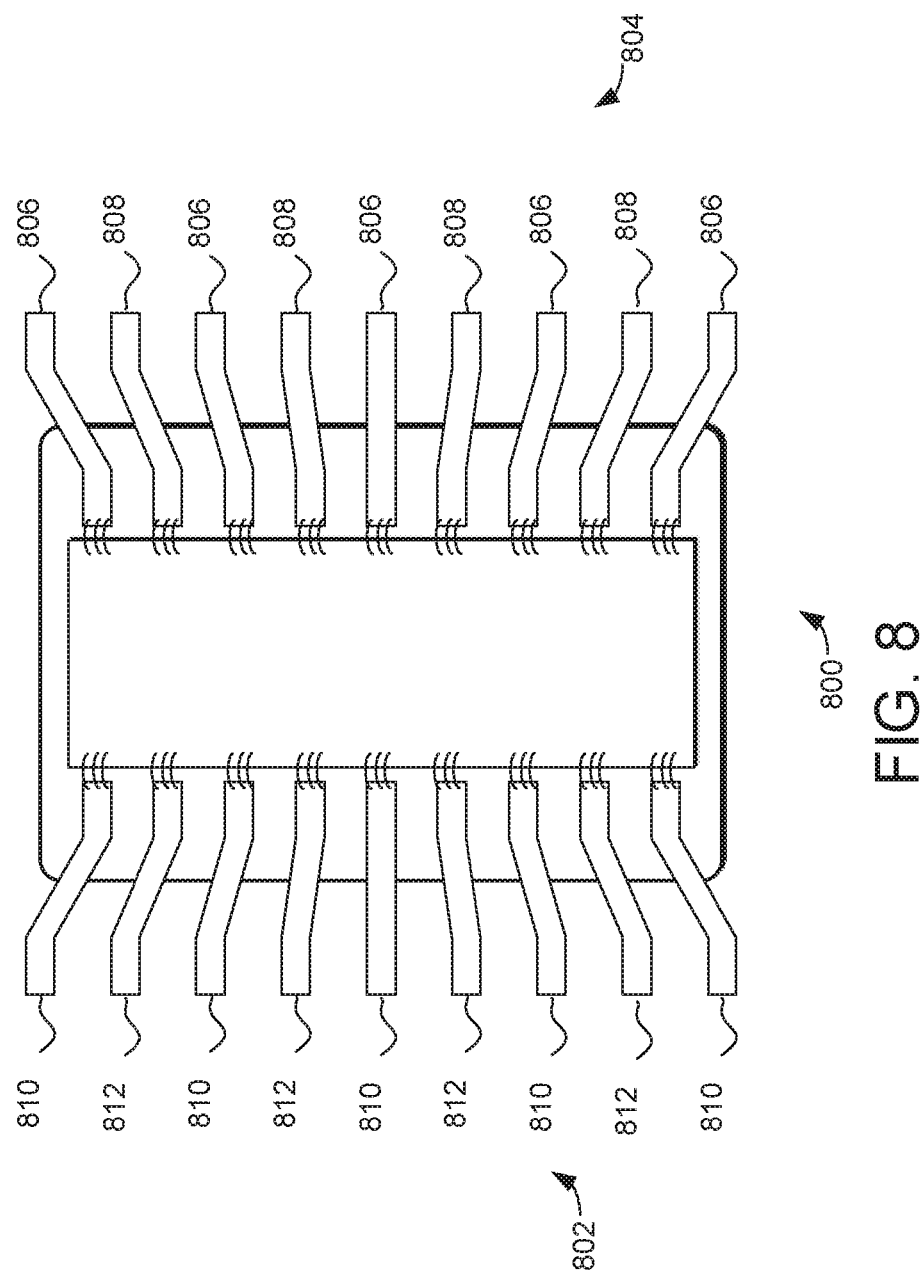

RADIO FREQUENCY (RF) DEVICES WITH RESONANT CIRCUITS TO REDUCE COUPLING

TECHNICAL FIELD

Embodiments of the subject matter described herein relate generally to radio frequency (RF) devices, including RF power amplifiers used in a variety of applications.

BACKGROUND

One issue in electronic circuit design is crosstalk. In general, crosstalk occurs when a signal on one conductive element creates an undesired electrical effect in another element. In general, crosstalk is the result of electromagnetic coupling between closely proximate elements. Unwanted crosstalk can negatively impact the performance of electronic circuits. Past attempts to improve circuit isolation and reduce electromagnetic coupling and have relied upon either a large shield structure or a grounding conductor.

Electromagnetic coupling and the resulting crosstalk is particularly problematic in high speed, radio frequency (RF) devices. For example, crosstalk between RF circuit elements such as circuit traces, bond wires and package leads can reduce gain, linearity, output power and efficiency in RF devices. Furthermore, the problems of crosstalk in RF devices become a greater issue as power and frequency increase and as the size of such devices decreases.

Thus, there remains a continuing need to improve isolation and reduce crosstalk in electronic circuits, and in particular in high speed RF devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 2A, 2B and 2C are schematic diagrams of portions of electronic devices in accordance with example embodiments;

FIG. 8 is a schematic diagram of a packaged semiconductor device in accordance with an example embodiment.

DETAILED DESCRIPTION

The embodiments described herein use resonant circuits to improve isolation between closely proximate conductors. For example, these resonant circuits can be used to reduce unwanted electromagnetic coupling and minimize crosstalk energy between package leads, bonding wires, and circuit board traces in radio frequency (RF) electronic devices, including multiple-path RF power amplifiers. To facilitate a reduction in electromagnetic coupling, embodiments of resonant circuits are configured resonate with the closely proximate conductors at a selected frequency $f_0$, and when resonating at the selected frequency $f_0$ the resonant circuit provides a path to ground for the crosstalk energy. This path to ground reduces the crosstalk energy that would otherwise be shared between the two closely proximate conductors, and thus improves the electromagnetic isolation between the conductors.

Figure 1:
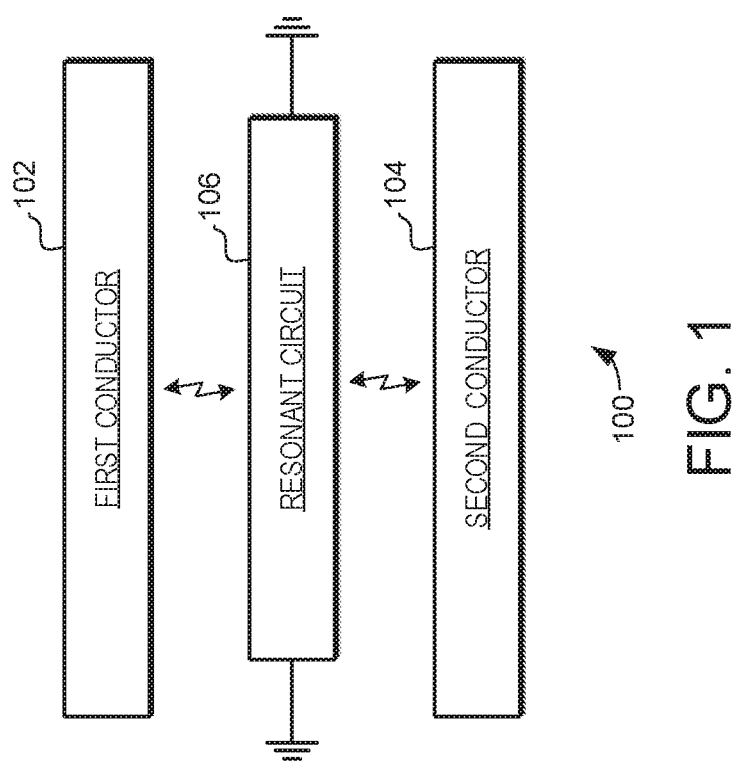
FIG. 1 is a schematic diagram of a portion of an electronic device in accordance with an example embodiment.

Turning now to FIG. 1, a schematic diagram of a portion of an electronic device 100 is illustrated. The electronic device 100 includes a first conductor 102, a second conductor 104, and a resonant circuit 106. The first conductor 102 and second conductor 104 are exemplary of any set of proximate conductors in an electronic device in which significant electromagnetic coupling and the potential for crosstalk exists.

In accordance with the embodiments described herein, the resonant circuit 106 is positioned between the first conductor 102 and second conductor 104 to reduce the electromagnetic coupling and potential for crosstalk. To facilitate the reduction in electromagnetic coupling and crosstalk, the resonant circuit 106 is configured to resonate with the first conductor 102 and second conductor 104 at a selected frequency $f_0$. Specifically, the resonant circuit 106 is configured to resonate at $f_0$, and when resonating to provide a path to ground for crosstalk energy. Thus, at least a portion of the crosstalk energy resulting from a signal in one conductor (e.g., first conductor 102 or second conductor 104) is drained to ground rather than creating an undesired electrical effect in the other conductor (e.g., second conductor 104 or first conductor 102). The reduction of crosstalk energy that is coupled from one conductor to the other can improve the performance of the electronic device 100.

As noted above, the first conductor 102 and second conductor 104 are exemplary of any set of proximate conductors in an electronic device in which significant electromagnetic coupling and the potential for crosstalk exists. For example, the first conductor 102 and the second conductor 104 can be circuit elements such as circuit board traces on a printed circuit board, bond wires and/or package leads. As other examples, the first conductor 102 and the second conductor 104 can be transistor fingers, power combing ports, power splitting ports, device package casings and/or covers.

Furthermore, the first conductor 102 and second conductor 104 can be elements in any type of electronic device in which it is desirable to reduce cross talk. For example, the first conductor 102 and second conductor 104 can be conductive elements in a radio frequency (RF) device, such as an RF power amplifier. In other embodiments the first conductor 102 and second conductor 104 can be conductive elements in a multi-path driver, harmonic control circuits, switching circuits, antenna arrays, power combiners, couplers, or isolator circuits.

In each of these embodiments the conductors 102 and 104 would include associated inductances, e.g., parasitic inductances. Additionally, a mutual capacitance would typically exist between the conductors 102 and 104. These associated inductances and mutual capacitance create electromagnetic coupling that can lead to excessive crosstalk. As will be described in greater detail below, the resonant circuit 106 is configured to resonate with the inductances of the conductors 102 and 104 at a desired frequency, and this resonating will reduce the crosstalk between the conductors 102 and 104.

Furthermore, the first conductor 102 and second conductor 104 can be in any relative physical configuration. For example, while FIG. 1 illustrates the first conductor 102 and second conductor 104 arranged with their major axes in parallel, and resonant circuit 106 between and also having its major axis in parallel with the first conductor 102 and second conductor 104, this is just one example implementation. As used herein, the "major axis", with respect to a conductor or a circuit, may be defined as a straight line drawn through an input end or node and an output end or node of the conductor or circuit.

Figure 2C:
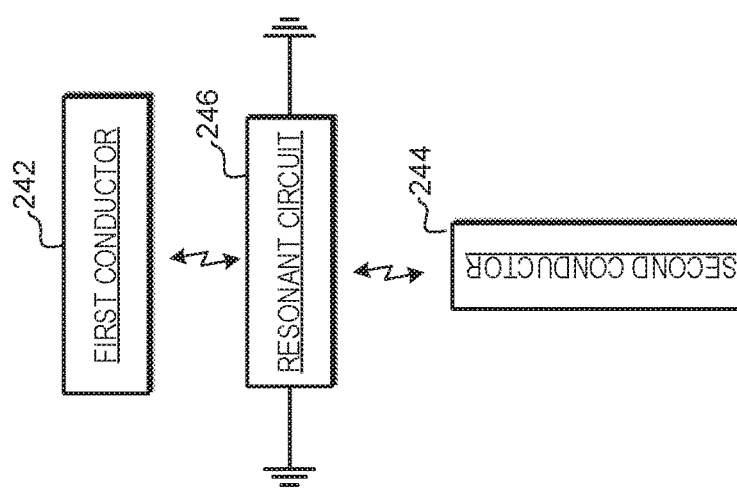

Turning now to FIGS. 2A, 2B, and 2C, other exemplary portions of electronic devices 200, 220 and 240 are illustrated. These electronic devices 200, 220 and 240 have proximate conductors in other relative configurations.

For example, the portion of electronic device 200 illustrated in FIG. 2A includes a first conductor 202, a second conductor 204, and a resonant circuit 206. In accordance with the embodiments described herein, the resonant circuit 206 is again positioned between the first conductor 202 and second conductor 204 to reduce the electromagnetic coupling and potential for crosstalk. However, FIG. 2A illustrates an example where the first conductor 202 and second conductor 204 have their major axes in a collinear arrangement. Additionally, the resonant circuit 206 is arranged between and with its major axis collinear with the first conductor 202 and second conductor 204.

As another example, the portion of electronic device 220 illustrated in FIG. 2B includes a first conductor 222, a second conductor 224, and a resonant circuit 226. In accordance with the embodiments described herein, the resonant circuit 226 is again positioned between the first conductor 222 and second conductor 224 to reduce the electromagnetic coupling and potential for crosstalk. However, FIG. 2B illustrates an example where the first conductor 222 and second conductor 224 have their major axes in a perpendicular arrangement. And in this case, the major axis of the resonant circuit 206 is collinear with the first conductor 222 and perpendicular to the second conductor 224.

As another example, the portion of electronic device 240 illustrated in FIG. 2C includes a first conductor 242, a second conductor 244, and a resonant circuit 246. In accordance with the embodiments described herein, the resonant circuit 246 is again positioned between the first conductor 242 and second conductor 244 to reduce the electromagnetic coupling and potential for crosstalk. FIG. 2C illustrates an example where the first conductor 242 and second conductor 244 again have their major axes in a perpendicular arrangement. However, in this case the major axis of the resonant circuit 206 is in parallel with the major axis of the first conductor 242 and is perpendicular to the major axis of the second conductor 244.

Figure 3:
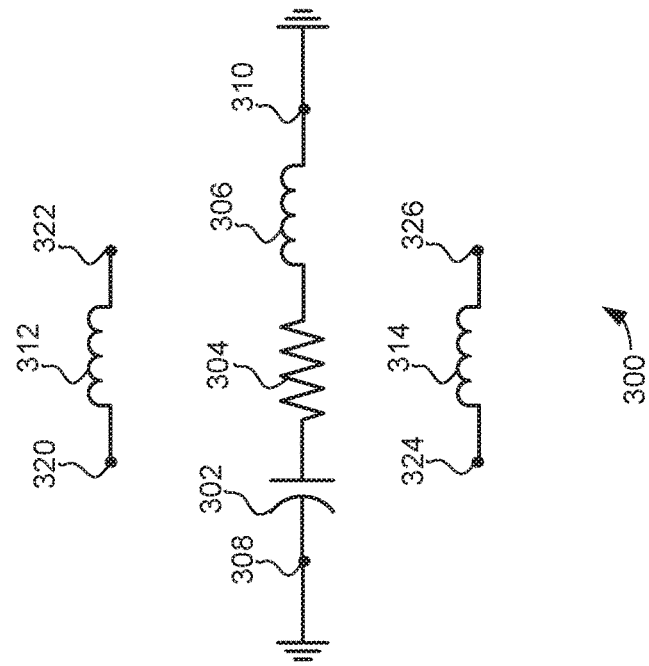
FIG. 3 is a circuit diagram of a resonant circuit in accordance with an example embodiment.

To facilitate the reduction in electromagnetic coupling and crosstalk, the resonant circuit (e.g., resonant circuit 106, 206, 226 and 246) is configured to resonate with a first conductor and a second conductor at a selected frequency $f_0$, and to provide a path to ground for crosstalk energy when resonating (i.e., energy at and around $f_0$). Turning now to FIG. 3, a circuit diagram illustrates an exemplary resonant circuit 300. The resonant circuit 300 is exemplary of the type of resonant circuits that can be used in the various embodiments described herein. The resonant circuit 300 includes a first capacitor 302, a resistor 304, an inductance 306, a first end 308 and a second end 310. In this illustrated embodiment, both the first end 308 and the second end 310 are connected to a reference voltage (e.g., ground). FIG. 3 shows the capacitor 302, resistor 304, and inductance 306 in a first series-coupled order. In other embodiments, the capacitor 302, resistor 304, and inductance 306 can be in any other order. Further, in other embodiments, multiple capacitors, resistors, and/or inductances may be included in the resonant circuit.

Also illustrated in FIG. 3 are inductance 312 and inductance 314. The inductance 312 represents the inductance of a first conductor, and the inductance 314 represents the inductance of a second conductor. The inductance 312 includes an input node 320 and an output node 322. Likewise, the inductance 314 includes an input node 324 and an output node 326. The resonant circuit 300 is configured to resonate at a selected frequency $f_0$ with electromagnetic energy emanating from the inductance 312 of the first conductor and/or with electromagnetic energy emanating from the inductance 314 of the second conductor. And when resonating with the inductances 312 and 314, the resonant circuit 300 provides a low impedance path to ground (through the first end 308 and/or second end 310) for crosstalk energy that could otherwise induce an unwanted effect in one or both of the conductors.

In a typical embodiment, the capacitance value of capacitor 302 and the inductance value of inductance 306 are selected to configure the resonant circuit 300 to resonate at the desired frequency. In such an embodiment the capacitor 302 can be any suitable type of capacitor, including an integrated passive device (IPD), lumped element capacitor, or any combination thereof. Furthermore, the capacitor 302 can be implemented with one or more capacitors connected in series and/or parallel. In one specific embodiment, the capacitor 302 can be implemented with one capacitor inside a device package, and another capacitor outside the package and coupled in series with the internal capacitor.

The inductance 306 can likewise be implemented with any suitable inductance. As one example, all or part of the inductance 306 can be provided by the parasitic inductance of a circuit element. For example, all or part the inductance 306 can be provided by the parasitic inductance of circuit traces, bond wires, or package leads. As a more specific example, part of the inductance 306 can be provided as the parasitic capacitance of a package lead, and part of the inductance 306 provided by a discrete inductor. In such a case the discrete inductor 302 could again comprise an IPD or a lumped element inductor.

In general, the resistor 304 determines the bandwidth of the resonant circuit 300. The resistor 304 can be implemented with any suitable resistive element. Again, in some cases the resistor 304 can implemented with one or more discrete resistors in combination with a parasitic resistance. In yet other embodiments no discrete resistor is needed.

Figure 4:
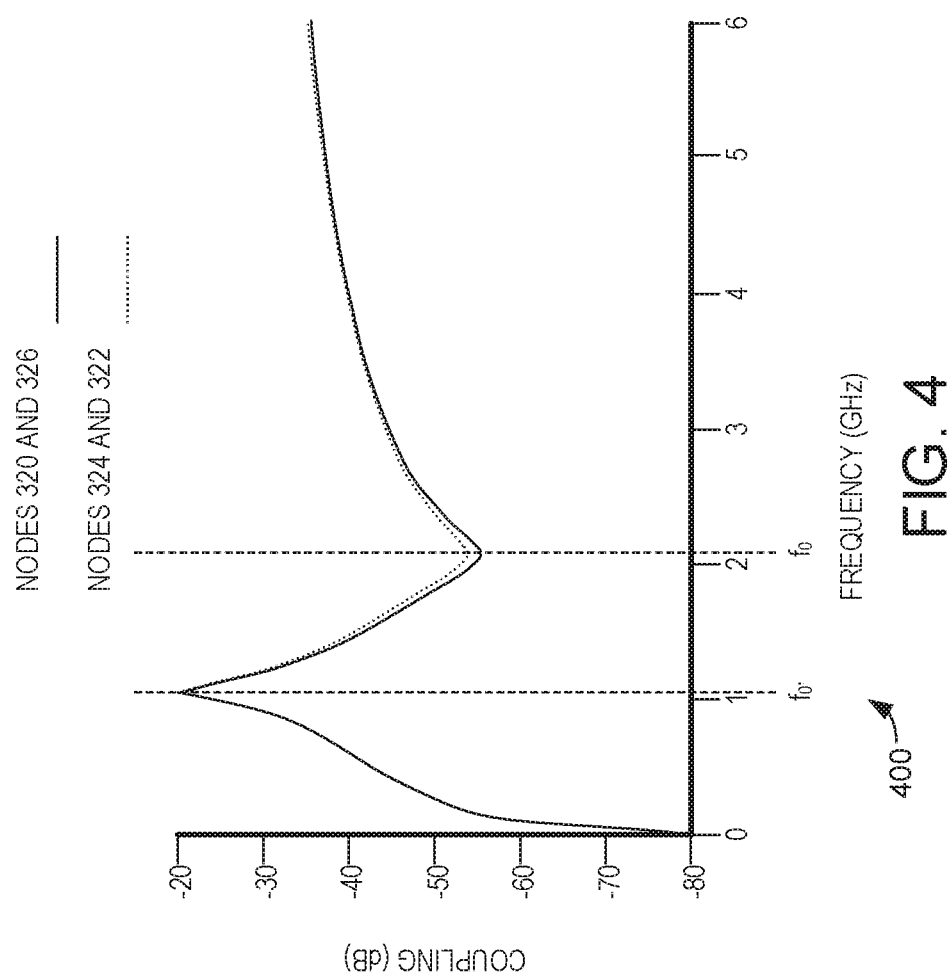
FIG. 4 is graphical representation of coupling between a first conductor and a second conductor with a resonant circuit in accordance with an example embodiment.

The capacitance value of capacitor 302 and the inductance value of inductance 306 are selected to resonate with the inductances 312 and 314 at the selected frequency $f_0$. Turning now to FIG. 4, a graph 400 illustrates exemplary coupling (in decibels (dB)) between a first conductor and a second conductor with a resonant circuit (e.g., resonant circuit 300) arranged between the conductors. Specifically, the graph 400 illustrates the coupling between an input node of the first conductor (e.g., node 320) and the output node of the second conductor (e.g., node 326) as a solid line. Likewise, the coupling between the input node of the second conductor (e.g., node 324) and the output node of the first conductor (e.g., node 322) is illustrated as a dotted line.

As can be seen in graph 400, the amount of electromagnetic coupling between the conductors varies as a function of frequency. Notably, the resonant circuit provides peak coupling at a frequency (labelled $f_0'$) that is approximately ½ the frequency where a local minimum amount of coupling occurs (labelled $f_0$). In this example, a peak in coupling occurs at approximately 1.1 GHz. Conversely, local minimums or "valleys" in coupling occur at approximately 2.15 GHz. These local minimums in coupling correspond to a frequency in which the resonant circuit resonates with the inductances of the proximate conductors. When resonating at such a frequency, the resonant circuit provides a low impedance path to ground for the crosstalk energy at that frequency. This path to ground reduces the crosstalk energy that would otherwise be shared between the two closely proximate conductors, and thus improves the electromagnetic isolation between the conductors. Again, this effect is illustrated by the local minimums or "valleys" in the graph 400.

To facilitate this reduction in coupling, the resonant circuit would be configured with capacitances, inductances and resistances designed to provide such a resonance at a desired frequency. For example, the series-coupled combination of the various impedances (capacitances, inductances and resistances) can be selected to resonate at the operational frequency of a main amplifier in a radio frequency (RF) device. To accomplish this, the impedance values of the capacitance 302, resistor 304, and inductance 306 can be selected to resonate with the inductances 312 and 314 at a selected frequency, and thus to provide the desired reduction in electromagnetic coupling. Again, this can involve the selection of discrete impedance elements to combine with intrinsic impedances of the circuit elements in the device.

In some cases it may be desirable to select the values of the impedances using simulation techniques. As one example, the simulation techniques can be based on the fact that the resonant circuit will have a peak coupling at a frequency that is approximately ½ the frequency where minimum coupling occurs. Thus, the impedance values can be initially selected to resonate with peak coupling at ½ of the selected frequency $f_0$. This would provide an initial starting point for determining the needed impedance values. In such technique $f_0$ can be defined as:

$$f_0 \cong \frac{1}{\pi(LC)^{1/2}}$$

where L is in the inductance (e.g., inductance 306) and C is the capacitance (e.g., capacitance of capacitor 302). It should be noted that the above equation provides only an approximation of the needed values L and C because the equation does not take into account the inductances of the proximate conductors (i.e., leads, bond wires) that are electromagnetically coupled to the resonant circuit. However, the above equation can provide approximate values for L and C that can be used as a starting point for simulations, and repeated simulations with adjusted values of L and C from such a starting point can then be used to determine the final values that will accurately provide the desired resonance with the proximate conductors at the frequency $f_0$.

Thus, with initial values selected, electromagnetic simulation using commercially available simulation tools can be performed, with the results of those simulations used to finely tune the values of the capacitances and inductances. Through repeated simulation the values of the capacitances and inductances needed to resonate with the proximate conductors to reduce coupling can be accurately determined.

With the capacitances and inductances determined, resistance values for a resistor in the resonant circuit can be added to the simulation to provide for adjustments in the bandwidth of the resonance. In general, the greater the resistance added, the greater the bandwidth of the resonant circuit. In typical applications it is generally desirable implement the resonant circuit to have a bandwidth that is approximately equal to the frequency bandwidth of interest in the associated device. Again, through repeated simulation the resistance needed, if any, to achieve this desired bandwidth can be accurately determined.

Figure 5:
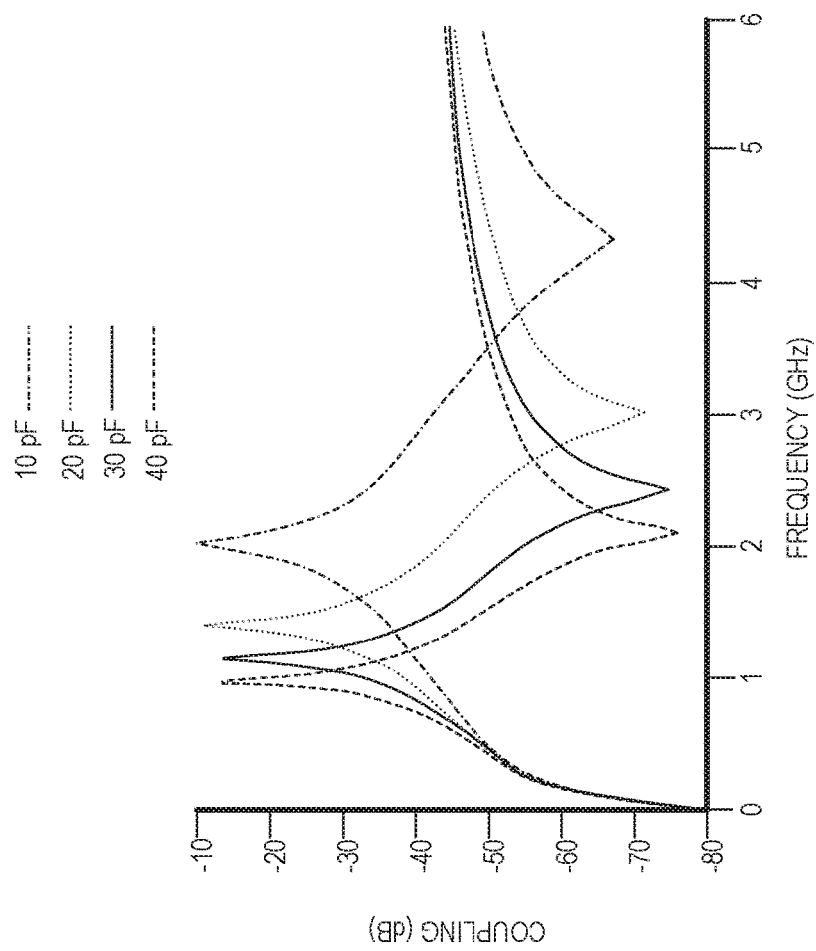
FIG. 5 is graphical representation of coupling between a first conductor and a second conductor with a resonant circuit having different capacitance values in accordance with an example embodiment.

Turning now to FIG. 5, a graph 500 illustrates exemplary coupling (in dB) between a first conductor and a second conductor with a resonant circuit (e.g., resonant circuit 300) arranged between the conductors. Specifically, the graph 500 illustrates the coupling with different capacitance values (e.g., values of capacitor 302) between 10 picofarads (pF) and 40 pF inclusive, in increments of 10 pF. As can be seen in graph 500, changing the value of the capacitance changes the frequency at which resonance occurs and coupling is minimized. Thus, by tuning the capacitance value, the resonant circuit can be made to reduce coupling between conductors at a desired operational frequency. In some embodiments, changes in the coupling frequency response of the resonant circuit can be made by adjusting the value of the inductance in the resonant circuit (e.g., the value of inductance 306).

Figure 6:
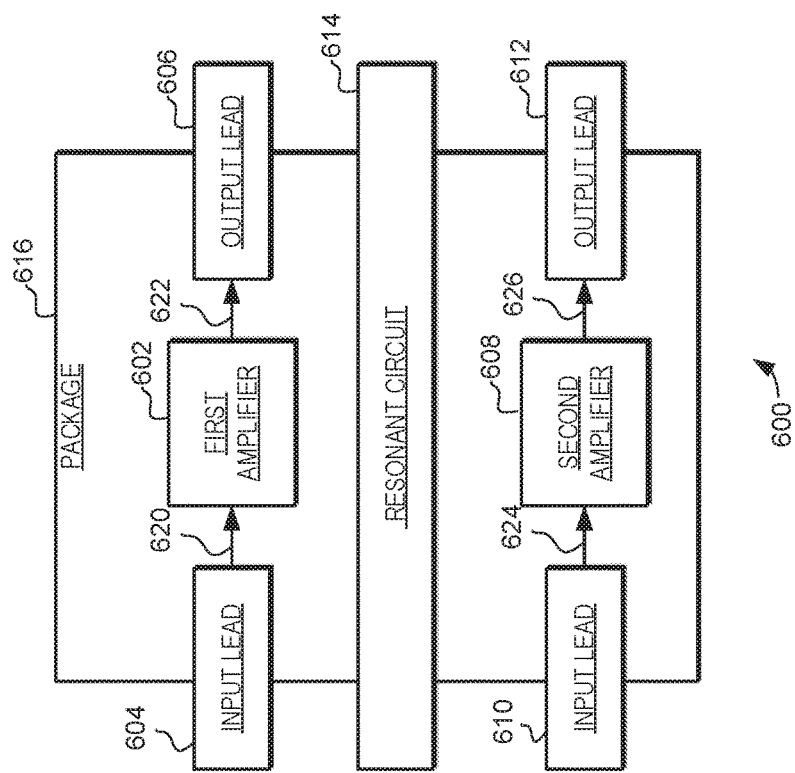
FIG. 6 is a schematic diagram of a portion of an amplifier device in accordance with an example embodiment.

Turning now to FIG. 6, a schematic diagram of a portion of an amplifier device 600 is illustrated. The amplifier device 600 is an example of the type of electronic device in which the embodiments described above can be implemented. The amplifier device 600 includes a first amplifier 602, a first input lead 604, a first output lead 606, a second amplifier 608, a second input lead 610, a second output lead 612 and a resonant circuit 614. The various leads are connected to their associated amplifiers through conductors 620, 622, 624, and 626, where those conductors can comprises bond wires, traces, a combination thereof, or any other suitable conductive structures. Finally, these components are encased in or are part of a package 616 (e.g., an overmolded package or an air cavity package).

In accordance with the embodiments described herein, the resonant circuit 614 is positioned between the conductors 620, 622, 624, and 626 and is configured to reduce the electromagnetic coupling and potential for crosstalk. For example, the resonant circuit 614 can be configured to reduce electromagnetic coupling between the output leads (e.g., between the first output lead 606 and the second output lead 612). As another example, the resonant circuit 614 can be configured to reduce electromagnetic coupling between the input leads (e.g., between the first input lead 604 and the second input lead 610). As another example, the resonant circuit 614 can be configured to reduce electromagnetic coupling between bond wires or other such conductive elements (e.g., between the conductors 620 and 624, and/or between conductors 622 and 626).

To facilitate the reduction in electromagnetic coupling and crosstalk, the resonant circuit 614 is configured to resonate with associated inductances of the conductors at a selected frequency $f_0$. For example, the leads (e.g., leads 604, 606, 610, 612) would each include an associated inductance, e.g., a parasitic inductance. The resonant circuit 614 can be configured resonate with the parasitic inductance of the leads for which electromagnetic coupling is to be reduced.

Specifically, the resonant circuit 614 is configured to resonate at $f_0$ with the associated parasitic inductances, and when resonating, to provide a path to ground for crosstalk energy. Thus, at least a portion of the crosstalk energy resulting from a signal in one conductor (e.g., first input lead 604 and/or first output lead 606) is drained to ground rather than creating an undesired electrical effect in the other conductor (e.g., second input lead 610 and/or second output lead 612). The reduction of crosstalk energy that is coupled from one conductor to the other can improve the performance of the amplifier device 600.

The package 616 can be any suitable type of semiconductor device package, where the term "package" means a collection of structural components (e.g., including a flange or substrate) to which the primary electrical components, including input and output leads 604, 606, 610, and 612, first amplifier 602, second amplifier 608 and resonant circuit 614 are coupled, where a "package" is a distinct device that may be coupled to a printed circuit board (PCB) or other substrate that includes other portions of the amplifier. According to one embodiment, the flange or substrate may serve as a ground reference node for the device, and the ends of the resonant circuit 614 may be coupled to ground through the flange. In other embodiments, the ends of the resonant circuit 614 may be coupled to leads, and when the device 600 is coupled to a PCB, those leads may be coupled to system ground. In still other embodiments, only one end of the resonant circuit 614 may be grounded through the flange or through a lead.

The amplifiers (e.g., first amplifier 602 and second amplifier 608) can likewise be implemented as a variety of different types of amplifiers. In one specific embodiment, such amplifiers are implemented as a portion of a Doherty amplifier. In general, Doherty amplifiers divide an RF signal and use amplifiers of different classes for different parts of the RF signal.

Specifically, Doherty amplifiers typically use a carrier amplifier and one or more peaking amplifiers, with the carrier amplifier used to drive the main body of the signal, and the one or more peaking amplifiers used to drive the peaks of the signal. In a typical Doherty implementation, when the input RF signal is at relatively low signal levels, the carrier amplifier operates near its compression point and thus with high efficiency, while the peaking amplifier(s) are not operating. Thus, at relatively low signal levels the Doherty amplifier can provide both high efficiency and good linearity. Then, when higher signal levels occur, the carrier amplifier compresses, and one or more of the peaking amplifier(s) start to operate and "tops up" the resulting output signal. Thus, the peaking amplifier(s) provide the ability to achieve high power output during times of high input signal levels. In such an implementation, the carrier amplifier can be operated as a class AB driver, and the peaking amplifier(s) are configured to operate as class C drivers.

Thus, the amplifiers of the Doherty amplifier together can provide relatively high power output and high efficiency. Stated another way, Doherty amplifiers thus can combine class AB and class C amplifiers in a way that maintains linearity while providing high power efficiency, and can further provide a high power output.

In such an embodiment, the first amplifier 602 can be implemented as a carrier amplifier in a Doherty amplifier, while the second amplifier 608 is implemented as a peaking amplifier. In other embodiments, both the first amplifier 602 and the second amplifier 608 are implemented as peaking amplifiers, and the device 600 may include another amplifier (not shown) that is operated as a carrier amplifier. In each case the first amplifier 602 and the second amplifier 608 can comprise one or more transistors (e.g., including a driver transistor and a final stage transistor, or just a final stage transistor). Thus, single stage (e.g., single transistor) carrier and peaking amplifiers can be used in some embodiments, and other embodiments can include multiple-stage amplifiers (e.g., in which each amplification path includes a driver transistor and a final-stage transistor coupled in series).

Figure 7:
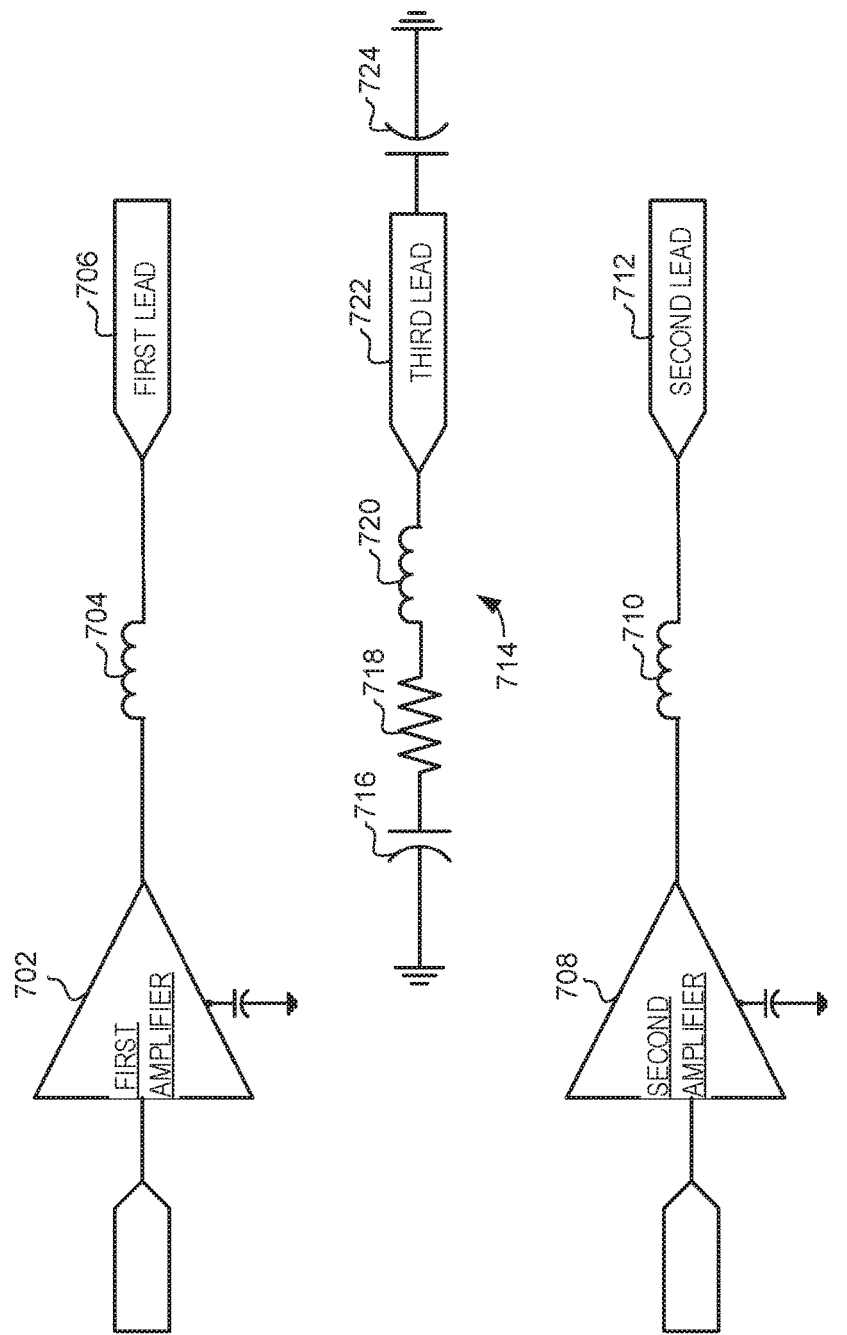
FIG. 7 is a circuit diagram of a portion of an amplifier device in accordance with an example embodiment.

In some embodiments the various components of the packaged device will also be incorporated into the resonant circuit. For example, the resonant circuit can be implemented to include bond wires, circuit traces, and/or package leads. Turning now to FIG. 7, a circuit diagram of a portion of an amplifier device 700 is illustrated. The amplifier device 700 is again an example of the type of electronic device in which the embodiments described above can be implemented. The amplifier device 700 includes a first amplifier 702, first bond wires 704, a first output lead 706, a second amplifier 708, second bond wires 710, and a second output lead 712.

In accordance with the embodiments described herein, the amplifier device 700 also includes a resonant circuit 714 that is positioned between the first output lead 706 and the second output lead 712. The resonant circuit 714 includes a first capacitor 716, a resistor 718, an inductance 720, and a third output lead 722, all coupled in series. FIG. 7 shows the capacitor 716, resistor 718, and inductance 720 in a first series-coupled order. In other embodiments, the capacitor 716, resistor 718, and inductance 720 can be in any other order. Further, in other embodiments, multiple capacitors, resistors, and/or inductances may be included in the resonant circuit.

In this illustrated embodiment, one or both ends of the resonant circuit 714 are again connected to a reference voltage (e.g., a ground node). For example, the end connected to capacitor 716 may be connected to a reference voltage through a flange to which the device components are coupled or through another lead (not shown). In addition, the third lead 722 may be coupled to a ground node on a PCB to which the device 700 is coupled.

The resonant circuit 714 is configured to resonate at a selected frequency $f_0$ with the inductances of the first output lead 706 and the second output lead 712. Furthermore, the resonant circuit 714 can be configured to be physically positioned between and resonate with the inductances of the first bond wires 704 and second bond wires 710. And when resonating with these inductances, the resonant circuit 714 provides a low impedance path to ground for crosstalk energy that could otherwise induce an unwanted effect in one or both of the output leads 706 and 712 and/or bond wires 704 and 710.

Again, the capacitance and inductance values, respectively, of the capacitor 716 and the inductance 720 are selected to configure the resonant circuit 714 to resonate at the desired frequency. And again, in such an embodiment the capacitor 716 can be any suitable type of capacitor. Furthermore, the capacitor 716 can be implemented with multiple capacitors connected in series and/or in parallel. In one specific embodiment, the capacitor 716 can be implemented with one capacitor inside a device package, and another capacitor (e.g., capacitor 724) outside the package. Such an embodiment can provide sufficient capacitance when space inside the package is limited.

The inductance 720 can likewise be implemented with any suitable inductance. Furthermore, in some embodiments the inductance 720 can be provided exclusively by parasitic inductance. For example, the inductance 720 can be provided by the inductance of the third output lead 722. In such an embodiment no additional inductance may be needed beyond that provided by the third output lead 722. In other embodiments the inductance 720 may be provided by bond wires, including bond wires providing connection to the third output lead 722. However, in yet other embodiments other inductance elements can be used, including discrete inductors such as IPDs or lumped element inductors.

And again, the resistor 718 can be used to define the bandwidth of the resonant circuit 714, and can again be implemented with any suitable resistive element. Again, in some cases the resistor 718 can implemented with discrete resistors in combination with a parasitic resistance. In yet other embodiments no discrete resistor is needed.

Thus, the resonant circuit 714 can be configured to resonate at $f_0$ with the associated parasitic inductances of the output leads 706 and 712, and when resonating to provide a path to ground for crosstalk energy. Thus, at least a portion of the crosstalk energy resulting from a signal in one output lead can be drained to ground through the third output lead 722 rather than creating an undesired electrical effect in the other output lead. The reduction of crosstalk energy that is coupled from one conductor to the other can improve the performance of the amplifier device 700.

In some cases it may be desirable to provide multiple resonant circuits in one packaged semiconductor device. Turning now to FIG. 8, an exemplary packaged semiconductor device 800 is illustrated. In this embodiment, the packaged semiconductor device includes leads 802 and 804. Various ones of these leads 802 and 804 can be input or output leads, where electromagnetic coupling can cause unwanted crosstalk between proximate leads. To reduce this crosstalk, some of the leads 802 and 804 can be implemented as parts of resonant circuits configured to reduce coupling.

For example, the leads 810 can be implemented as input leads for RF devices inside the packaged semiconductor device 800. Likewise, leads 806 can be implemented as output leads for the RF devices. In such an embodiment, each of the leads 812 can be implemented as part of a resonant circuit, where the resonant circuit is positioned between input leads 810 and provides isolation to reduce coupling between the input leads 810. Likewise, each of the leads 808 can be implemented as part of a resonant circuit, where the resonant circuit is positioned between output leads 806 and provides isolation to reduce coupling between the output leads 806. Thus, the packaged semiconductor device 800 can have improved device isolation and performance.

In one embodiment, a device comprises: a first conductor, a second conductor adjacent to the first conductor; and a resonant circuit, the resonant circuit physically located at least in part between the first conductor and the second conductor, the resonant circuit electromagnetically coupled to and configured to resonate with the first conductor and the second conductor at a frequency f0, and when resonating to provide a path to a ground node for crosstalk energy and reduce electromagnetic coupling between the first conductor and the second conductor.

In a second embodiment, an amplifier device comprises: a device package including at least a first package lead and a second package lead, the device package encasing: a first amplifier, the first amplifier coupled to the first package lead through first bond wires, and where a first inductance is associated with at least one of the first package lead and the first bond wires; a second amplifier, the second amplifier coupled to the second package lead through second bond wires, and where a second inductance is associated with at least one of the second package lead and the second bond wires; and a resonant circuit, the resonant circuit physically located at least in part between at least one of the first package lead and the second package lead and the first bond wires and the second bond wires, the resonant circuit electromagnetically coupled to and configured to resonate with the first inductance and the second inductance at a frequency f0, and when resonating to provide a path to a ground node for crosstalk energy and reduce electromagnetic coupling between the at least one of the first package lead and the second package lead and the first bond wires and the second bond wires.

In another embodiment, an RF amplifier device comprises: a device package including at least a first package lead, a second package lead, and a third package lead, the device package encasing: a first amplifier, the first amplifier coupled to the first package lead, and where a first inductance is associated with the first package lead; a second amplifier, the second amplifier coupled to the second package lead, and where a second inductance is associated with the second package lead; and a resonant circuit, the resonant circuit including a third inductance provided at least in part by the third package lead, a resistor, and a first capacitor, where the third package lead, the resistor, and the first capacitor are coupled together in series and are located at least in part between the first package lead and the second package lead, the resonant circuit configured to resonate with the first inductance and the second inductance at a frequency f0, and when resonating to provide a path to a ground node for crosstalk energy and reduce electromagnetic coupling between the first package lead and the second package lead.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected"

means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
    a first conductor,
    a second conductor adjacent to the first conductor; and
    a resonant circuit, the resonant circuit physically located at least in part between the first conductor and the second conductor, the resonant circuit electromagnetically coupled to and configured to resonate with the first conductor and the second conductor at a frequency $f_0$, and when resonating to provide a path to a ground node for crosstalk energy and reduce electromagnetic coupling between the first conductor and the second conductor, wherein the resonant circuit comprises a first capacitor in series with an inductance, and wherein the resonant circuit includes a first end and a second end, and wherein the first end is coupled to a first ground node and wherein the second end is coupled to a second ground node.

2. The device of claim 1, wherein the resonant circuit includes a second capacitor.

3. The device of claim 1, wherein the first conductor comprises a first package lead and wherein the second conductor comprises a second package lead.

4. The device of claim 1, wherein the first conductor comprises first bond wires and wherein the second conductor comprises second bond wires.

5. The device of claim 1, wherein the first conductor comprises first circuit board traces and wherein the second conductor comprises second circuit board traces.

6. The device of claim 1, wherein the device comprises a radio frequency (RF) amplifier, and wherein the first conductor comprises a first package lead providing a first output of the RF amplifier, and wherein the second conductor comprises a second package lead providing a second output of the RF amplifier, and wherein the resonant circuit further comprises a third package lead, the third package lead between the first package lead and the second package lead, and wherein the third package lead provides an inductance.

7. An amplifier device comprising:
    a device package including at least a first package lead and a second package lead, the device package encasing:
    a first amplifier, the first amplifier coupled to the first package lead through first bond wires, and where a first inductance is associated with at least one of the first package lead and the first bond wires;
    a second amplifier, the second amplifier coupled to the second package lead through second bond wires, and where a second inductance is associated with at least one of the second package lead and the second bond wires; and
    a resonant circuit, the resonant circuit physically located at least in part between at least one of the first package lead and the second package lead and the first bond wires and the second bond wires, the resonant circuit electromagnetically coupled to and configured to resonate with the first inductance and the second inductance at a frequency $f_0$, and when resonating to provide a path to a ground node for crosstalk energy and reduce electromagnetic coupling between the at least one of the first package lead and the second package lead and the first bond wires and the second bond wires.

8. The amplifier device of claim 7, wherein the resonant circuit comprises a first capacitor in series with at least one of third bond wires and a third package lead.

9. The amplifier device of claim 8, wherein the resonant circuit includes a first end and a second end, and wherein the first end is coupled to the ground node and wherein the second end is coupled to the ground node.

10. The amplifier device of claim 7, wherein the resonant circuit comprises a first capacitor, and at least one of third bond wires and a third package lead, the at least one of the third bond wires and the third package lead providing a third inductance, and wherein the first capacitor, and at least one of the third bond wires and the third package lead are coupled together in series.

11. The amplifier device of claim 10, wherein the resonant circuit further comprises a resistor in series with the first capacitor, and at least one of the third bond wires and the third package lead.

12. The amplifier device of claim 11, wherein the resonant circuit includes a first end and a second end, and wherein the first end is coupled to a first reference ground node inside the package, and wherein the second end is coupled to a second reference ground node outside the package.

13. The amplifier device of claim 11, wherein the resonant circuit includes a second capacitor, and wherein the first capacitor is located inside the package and wherein the second capacitor is located outside the package.

14. A radio frequency (RF) amplifier device comprising:
    a device package including at least a first package lead, a second package lead, and a third package lead, the device package encasing:
    a first amplifier, the first amplifier coupled to the first package lead, and where a first inductance is associated with the first package lead;
    a second amplifier, the second amplifier coupled to the second package lead, and where a second inductance is associated with the second package lead; and
    a resonant circuit, the resonant circuit including a third inductance provided at least in part by the third package lead, a resistor, and a first capacitor, where the third package lead, the resistor, and the first capacitor are coupled together in series and are located at least in part between the first package lead and the second package lead, the resonant circuit configured to resonate with the first inductance and the second inductance at a frequency $f_0$, and when resonating to provide a path to a ground node for crosstalk energy and reduce electromagnetic coupling between the first package lead and the second package lead.

15. The RF amplifier device of claim 14, wherein the third inductance is additionally provided in part by bond wires coupled to the third package lead.

16. The RF amplifier device of claim 14, wherein the third inductance is additionally provided in part by an inductor.

17. The RF amplifier device of claim 14, wherein the resonant circuit further comprises a second capacitor in series with the first capacitor, wherein the second capacitor is coupled to the third package lead and is outside the package.

18. The RF amplifier device of claim 14, wherein the resonant circuit includes a first end opposite the third package lead, and wherein the first end is coupled to the ground node, and wherein the third package lead is coupled to the ground node.

* * * * *